US006209790B1

(12) United States Patent
Houdeau et al.

(10) Patent No.: US 6,209,790 B1
(45) Date of Patent: Apr. 3, 2001

(54) DATA MEDIUM IN CARD FORM AND LEAD FRAME FOR USE IN SUCH A DATA MEDIUM

(75) Inventors: Detlef Houdeau, Regensburg; Josef Kirschbauer, Blaibach; Christoph Filser, Wörishofen, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/930,236

(22) PCT Filed: Mar. 15, 1996

(86) PCT No.: PCT/DE96/00464

§ 371 Date: Sep. 26, 1997

§ 102(e) Date: Sep. 26, 1997

(87) PCT Pub. No.: WO96/30867

PCT Pub. Date: Oct. 3, 1996

(30) Foreign Application Priority Data

Mar. 31, 1995 (DE) .............................................. 195 12 191

(51) Int. Cl.[7] .................................................... G06K 19/06

(52) U.S. Cl. .......................... 235/491; 235/492; 235/487; 29/826; 257/679; 438/123

(58) Field of Search ...................................... 235/491, 492, 235/486, 487; 29/826, 843; 257/666, 679, 678; 438/111, 112, 123

(56) References Cited

U.S. PATENT DOCUMENTS

| 3,702,464 | * | 11/1972 | Castrucci | 235/491 |
| 4,501,960 | * | 2/1985 | Jouvet et al. | 235/492 |
| 4,578,573 | | 3/1986 | Flies et al. | 235/492 |
| 4,727,246 | * | 2/1988 | Hara et al. | 235/488 |
| 4,803,542 | * | 2/1989 | Haghiri-Tehrani et al. | 357/72 |
| 4,822,988 | * | 4/1989 | Gloton | 235/492 |

(List continued on next page.)

FOREIGN PATENT DOCUMENTS

| 31 11 516 A1 | 12/1982 | (DE) . | |
| 41 05 869 A1 | 8/1992 | (DE) . | |
| 4435122 | * | 9/1994 | (DE) | H01L/25/065 |
| 44 41 931 C1 | 7/1995 | (DE) . | |
| 0 121 268 | 10/1984 | (EP) . | |
| 0 254 640 A1 | 1/1988 | (EP) . | |
| 0 343 030 B1 | 11/1989 | (EP) . | |
| 0 599 194 A1 | 1/1994 | (EP) . | |
| WO 92/13318 | 6/1992 | (WO) . | |

OTHER PUBLICATIONS

Patent Abstracts of Japan, vol. 11, No. 319, Oct. 17,1987, & Japanese reference 62–107391 dated May 18, 1987.

Primary Examiner—Karl D. Frech
Assistant Examiner—Daniel St. Cyr
(74) Attorney, Agent, or Firm—Schiff Hardin & Waite

(57) ABSTRACT

A data medium in card form has a least one semiconductor memory element with a storage capacity of at least one megabit and has electroplated contacts for transmission of data between a data processing system the semiconductor memory elements of the data medium. Electrical conductor paths on the data medium connect the semiconductor memory element to the electroplated contacts. The electrical conductor paths are a single leadframe on which at least parts of the electroplated contacts are integrally formed. The leadframe is formed of a resilient material.

5 Claims, 1 Drawing Sheet

U.S. PATENT DOCUMENTS

| | | | |
|---|---|---|---|
| 5,049,728 | * | 9/1991 | Rovin ................................. 235/492 |
| 5,151,774 | * | 9/1992 | Mori et al. ......................... 235/492 |
| 5,203,078 | * | 4/1993 | Nakanishi et al. .................. 29/843 |
| 5,206,495 | * | 4/1993 | Kreft .................................. 235/492 |
| 5,612,532 | * | 3/1997 | Iwasaki .............................. 235/486 |
| 5,925,928 | * | 7/1999 | Hafner et al. ...................... 357/679 |

* cited by examiner

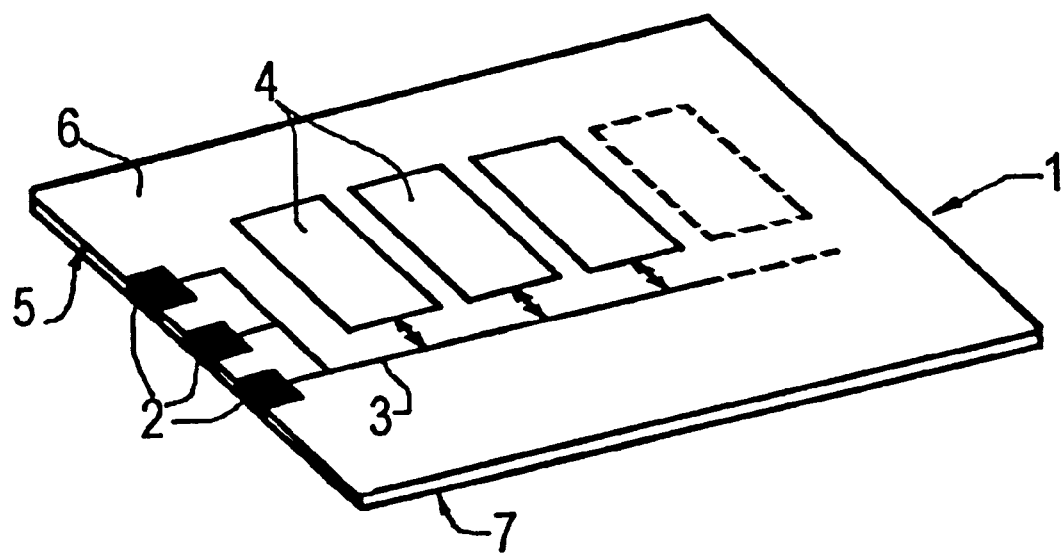

DATA MEDIUM IN CARD FORM AND LEAD FRAME FOR USE IN SUCH A DATA MEDIUM

BACKGROUND OF THE INVENTION

The invention relates to a data medium in card form which is produced substantially from plastic, may have metal parts, comprises a large semiconductor memory capacity and, for data transmission, can be externally bonded via electroplated contacts.

An example of data medium systems currently known and in use is that of magnetic tapes, which generally consist of polyester and are covered with a magnetic powder or a magnetizable layer. Many forms which this takes may be mentioned, such as tapes, cassettes, cartridges or else that of the smart card, which consists, for example, of PVC (polyvinylchloride) and may have an impressed structure or a magnetic strip. Furthermore, optical systems are known, such as CD (compact disc; CD-ROM/compact disc; read-only memory). The individual forms may be only readable or readable and also rewritable.

The latest data medium systems comprise one or more semiconductor memory elements. Suitable for this, in particular also for reasons of cost, are commercial random-access memories. These may be designed, for example, as a DRAM (dynamic random-access memory). Today, the most popular type of data medium system, in particular data medium card, is the smart card. Also known are data media for data processing systems (PCMCIA standard), which can be used, for example, on a personal computer for backup as external data media. These comprise a multiplicity of semiconductor elements and may also serve, for example, as a substitute for a hard disc.

In the case of the so-called smart card, in a version as a chip card, and in the case of a memory card, the contact-dependent data transmission is generally performed using electroplated contacts. This constitutes a fundamental difference in comparison with an electronic standard component. A DIL (dual in line) package of a semiconductor chip has entirely different external bonding means than one of the cards mentioned. In the case of a data medium in card form of the abovementioned type, plug contacts are generally used, specially designed according to type and requirements. Firstly, the semiconductor memory elements have to be integrated into the plastic cards, these cards not necessarily having to conform in their dimensions to a standard for chip cards, although it is advisable for them to do so. What is essential is that the required memory capacity of the semiconductor elements in a data medium card is combined with an essential space requirement for such semiconductor memory chips. The data medium systems in the form of a data medium card have, as stated, so-called plug and pull contacts and must correspondingly transfer forces in order that the card can be plugged into or pulled out with the corresponding contacts on a data processing system or on an adapter. Since the relatively large main faces of such a data medium card are to serve essentially for imparting advertising information, it would be important to make the electroplated contacts intrinsically stable, in order not to cause damage to the advertising areas by a transfer of force to the plastic body of the data medium. This must also be seen against the background that, in use, such a card is to withstand as far as possible without any damage a very high number of insertion and removal operations.

Examples of special configurations of electroplated contact connections which may be mentioned at this stage are plug and pull contacts or snap connections, multipoint connectors and terminal strips or the like.

It is evident that the external electrical connection of a semiconductor device takes place in any case via a disconnectable electrical connection. In contrast to this, the standard assembly process of a semiconductor device in conjunction with a leadframe provides a non-disconnectable electrical and mechanical connection of the outer leads. The assembly technique in the case of a chip card cannot be transferred to a data medium of the type described above in as far as the module inserted into a chip card is very small in relation to the size of the data medium card.

SUMMARY OF THE INVENTION

The invention is based on the object of providing a data medium in card form which has one or more semiconductor memory elements with a substantial space requirement within the card, for data transmission is provided externally with electroplated contacts and, during operation, has overall high stability, with respect to the plastic body and the contacts. Also to be provided is a leadframe which is designed for use in such a data medium in card form, with the corresponding requirements, and which significantly simplifies the production process of the data medium.

The invention is based on the realization that special advantages are associated with a leadframe which is of an integral or one-piece design with the electroplated contacts or with parts thereof. This means that the leadframe serves on the one hand for the electrical bonding and mechanical securement of the semiconductor memory element or elements and on the other hand for the forming of the electroplated contacts. No conventional leadframe material can be used for this purpose. In order to meet the requirements, on the one hand concerning semiconductor memory elements and on the other hand concerning electroplated contacts, a compromise has to be made in the case of the material used.

In an advantageous way, a special resilient material is used, which has such material characteristics that it simultaneously meets requirements on the chip bonding, and also the requirements on the electroplated contacts. With respect to the requirements, it should be mentioned in particular that the temperature coefficient of the modulus of elasticity (temperature dependence, also referred to as temperature sensitivity) is very low. At the same time, the coefficient of thermal expansion is likewise to be low, in order that a good adaptation of the metallic leadframe, which bears semiconductor elements, to the material of a semiconductor element is ensured. Furthermore, a high or very high resilient bending limit is desired. It is also not to drop significantly even at relatively high temperatures.

A special resilient material with the said requirements consequently meets on the one hand the requirements which are imposed on electrical conductor paths and on the leadframes, together with the requirements which are imposed on, for example, resilient electroplated contacts. Points to bear in mind overall in this respect are the chip fixing, the chip positioning on an island of a leadframe, the electrical current carrying, and also the external bonding and the resilient properties of contacts, such as they are desired from precision engineering. Consequently, the electrical conductor or conductors are of an integral or one-piece design with the external contacts of a data medium in card form.

To be mentioned as a special material selection are the alloys copper-tin-6 and copper-tin-8 (CuSn6, CuSn8). These are particularly favourable combined leadframe materials with resilient properties. Desirable in this context is, for example, a yield strength of over 1000 N/mm². This value can be achieved, for example, by iron-nickel alloys. In order to reduce the corrosion susceptibility of iron alloys, they are alloyed with chromium fractions. For example, the use of an alloy such as iron/nickel/42/chromium/5 (FeNi42Cr5) is advantageous. This alloy meets the abovementioned requirements and likewise has corrosion protection, so that there is no need for coating the leadframe with a layer of noble metal. The chromium fraction brings about a self-passivation. By further metallurgical or metallographic adjustments, such as for example high purity of the material or low particle size, a positive influence can be brought to bear on, for example, the electrical conductivity.

The previous use of leadframes in the production of plastic-encapsulated electronic components envisages the mechanical securement of the electronic components on an island of the leadframe, the electrical bonding between the electronic components and the inner leads of the leadframe also being performed. No resilient material properties are necessary for this. Consequently, the material of the leadframe was to be optimized to be adapted in the best way possible to the material properties of the semiconductor component. A leadframe for use in a data medium in card form which is to have, in addition to the properties mentioned, resilient material properties as well, can, in an advantageous way, introduce into a data medium arrangement in card form an overall supporting or stabilizing property. This is important in particular in the production of data media in card form, since injection-moulding processes using thermoplastics or thermoplastic polymers are being increasingly used for this. Consequently, there is initially provided in the form of the leadframe according to the invention a stable unit with electrically connected semiconductor memory elements assembled thereupon, which has at least parts of the electroplated outer contacts. This unit can be fed extremely advantageously in tape form to an injection-moulding process for the production of data media in card form, parts of the leadframe being intended for a positioning, for example within a cavity. After such encapsulation in a thermoplastic, only the strip or row of electroplated contacts can be seen from the outside of the semiconductor elements and the leadframe. To further increase the stability of the leadframe for a production process, stabilizing shapings may be used, for example, on the leadframe (folding or the like).

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE depicts a card for a data medium according to the present invention.

DESCRIPTION OF THE PREFERRED EMBODIMENTS

The FIGURE diagrammatically shows a data medium 1 in card form with memory chips 4 located thereupon or therein. The data medium 1 is produced in one or more layers from a thermoplastic polymer and has peripheral side faces 5, and also two main faces 6, 7. Contacts 2 for data transmission from or to the data medium 1 are arranged in this example at the edge, that is to say in the region of a side face 5. As shown in the FIGURE, the arrangement of the contacts 2 is provided on one narrow side of the data medium 1. In principle, this contact arrangement may also take place at any other location at the edge of the data medium. However, there must be a number and positioning of contacts 2 which is standard for the type of data medium, with the result that there is a required standardization for daily use with corresponding data-reading systems.

On the data medium 1 there is at least one memory chip 4, i.e. at least one semiconductor memory element, which is connected to contacts 2 via a bus 3 or via a bus line or via a bus system (address bus, control bus, data bus), depending on the requirement for the rate of data transmission. For reasons of cost, recourse is made to the common types of semiconductor memory elements. In this case, by multiple arrangement of memory chips 4, the storage capacity of the data medium 1 can be correspondingly increased stage by stage. The three memory chips 4 shown in the FIGURE, which are each independently connected to the bus 3, may be varied or maximized in their number depending on the space available on the data medium 1. Correspondingly, different data media 1 with differing storage capacity and correspondingly differing price can be offered. The minimum storage capacity of a data medium 1 is at least 1 Mbit. Such a data medium would have adequate storage capacity for the storage of data for, for example, a piece of music. In this case, the data medium 1 substantially comprises only semiconductor memory elements.

In the case of the previously known chip cards (smart card), the identification system was at the forefront. In this case, access to a memory located therein is monitored by a safety logic. In the simplest case, this is a write or erase protection for the memory or for individual areas of the same. In addition, there are memory chips with a complex safety logic. The functionality of the chip cards is usually optimized for a specific application. Typical applications in this respect are, for example, that of a phonecard or sickness insurance card. Apart from the memory cards described, known in the family of chip cards are so-called microprocessor cards. These generally contain at least one program (operating system) and process or handle data in a particular prescribed manner. A common feature of both, the memory cards and the microprocessor cards, is, however, that either an identification system for access to the stored data or a foreground processor charac-teristic is implied.

A data medium 1 in card form corresponding to the invention has virtually exclusively semiconductor memory elements. Logic units for the general management of the stored data are to the greatest extent relocated into a data-processing or data-reading system and are not located on the data medium 1. The data medium 1 is connected via the contacts 2 to such a data-processing system. In this case there is the possibility that, again to expand the storage capacity, a plurality of data media 1 can be stacked and can be connected as a stack or one after the other to the data-processing system. The memory chips 4 are located in the interior of the data medium 1. Consequently, the two main faces 6, 7 of the data medium 1 in card form can be used as advertising areas. Since the data media may be in circulation in their hundreds of millions, their surfaces are used intensively as advertising areas or as areas for identification imprints.

On the one hand, for reasons of compatibility, it would be advisable to adopt the lateral dimensions of the smart card (ISO 7812/7816; International Organization for Standardization). On the other hand, for a data medium in card form corresponding to the invention, there is no necessity to adapt the outer dimensions to an existing standard. The thickness of the data medium 1 in card form is in any event greater than that of the smart card. This is attributable to the overall height of the memory chips 4. To estimate the total thickness or height of the data medium 1, further elements of the height for the mechanical and electrical connection of the memory chips 4 and also for corresponding layers of plastic of the substrate have to be included in the calculation. The total thickness of the data medium 1 may be, for example, 2 or 3 mm. Due to the two-dimensional configuration of the memory chips 4, flexibility similar to that of the smart card cannot be ensured.

Further uses for a data medium 1 in card form would be, for example, applications for portable computers, video or other image-display processes.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for manufacturing a data medium in card form having at least one semiconductor memory element with a storage capacity of at least one megabit and having electroplated contacts for transmission of data between a data-processing system and the at least one semiconductor memory element of the data medium, comprising the steps of:

providing a lead frame and mounting the at least one semiconductor memory element to a portion of the lead frame, another portion of said lead frame forming said electroplated outer contacts so that said electroplated outer contacts are integral with said lead frame; and feeding said lead frame in tape form to an injection-molding process where the lead frame is encapsulated in a thermoplastic and wherein the electroplated contacts of the lead frame are provided along one side edge of a card formed by said thermoplastic encapsulation, the lead frame providing a resilient mounting support for the at least one memory chip as the lead frame is being encapsulated.

2. The method according to claim 1 wherein the electroplated contacts wrap around said one side edge of the card.

3. The method according to claim 1 wherein a plurality of said semiconductor memory elements are provided arranged parallel to one another being mounted to said lead frame, and connecting to a bus line formed by a portion of said lead frame.

4. The method according to claim 1 wherein said lead frame consists of one of the elements of the group consisting of $CuSn_6$ and $CuSn_8$.

5. The method according to claim 1 wherein the lead frame consists of $FeNi_{42}Cr_5$.

* * * * *